United States Patent
Sung et al.

(10) Patent No.: US 7,872,256 B2
(45) Date of Patent: Jan. 18, 2011

(54) ORGANIC LIGHT EMITTING DISPLAY AND FABRICATION METHOD OF THE SAME

(75) Inventors: Yeun-Joo Sung, Suwon-si (KR);
Hee-Seong Jeong, Suwon-si (KR);
Byeong-Wook Yoo, Suwon-si (KR);
Jun-Sik Oh, Suwon-si (KR); Sam-Il Kho, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 889 days.

(21) Appl. No.: 11/727,324

(22) Filed: Mar. 26, 2007

(65) Prior Publication Data

US 2008/0111474 A1 May 15, 2008

(30) Foreign Application Priority Data

Nov. 10, 2006 (KR) .................. 10-2006-0111161

(51) Int. Cl.
*H01L 51/52* (2006.01)
(52) U.S. Cl. .......... 257/40; 257/E51.018; 257/E51.022; 438/99; 313/504
(58) Field of Classification Search .................. 257/40, 257/E51.018–E51.019, E51.021–E51.022, 257/E51.026; 438/99; 313/504, 506, 509
See application file for complete search history.

(56) References Cited

U.S. PATENT DOCUMENTS

| | | | | |
|---|---|---|---|---|
| 5,554,911 A * | 9/1996 | Nakayama et al. | ........... | 313/504 |
| 5,998,805 A * | 12/1999 | Shi et al. | ...................... | 257/40 |
| 7,598,671 B2 * | 10/2009 | Song et al. | ................... | 313/506 |
| 7,601,988 B2 * | 10/2009 | Seo et al. | ........................ | 257/88 |
| 2003/0044639 A1 * | 3/2003 | Fukuda | ........................ | 428/690 |
| 2005/0017630 A1 * | 1/2005 | Ryu et al. | .................... | 313/504 |
| 2005/0040756 A1 * | 2/2005 | Winters et al. | ............... | 313/504 |
| 2005/0142976 A1 * | 6/2005 | Suzuki | .......................... | 445/24 |
| 2005/0225233 A1 * | 10/2005 | Boroson et al. | ............. | 313/504 |
| 2005/0249972 A1 * | 11/2005 | Hatwar et al. | ................ | 428/690 |

(Continued)

FOREIGN PATENT DOCUMENTS

JP    2006-269327    10/2006

(Continued)

OTHER PUBLICATIONS

Kashiwabara, M., et al. "Late News Paper: Advanced AM-OLED Display Based on White Emitter with Microcavity Structure." SID 04 Digest, No. 29.5L (2004): pp. 1017-1019.*

(Continued)

*Primary Examiner*—Matthew W Such
(74) *Attorney, Agent, or Firm*—Robert E. Bushnell, Esq.

(57) ABSTRACT

An organic light emitting display that includes a substrate, a plurality of first electrodes arranged in a corresponding plurality of pixels, the plurality of pixels including red pixels, blue pixels and green pixels, a hole injection layer arranged on the first electrodes arranged on the substrate, the hole injection layer having different respective thicknesses in correspondence with the pixels, a hole transport layer entirely covering the hole injection layer, a white light emitting layer entirely covering the hole transport layer, an electron transport layer arranged on the white light emitting layer, a second electrode arranged on the electron transport layer and a color filter arranged on the second electrode.

11 Claims, 8 Drawing Sheets

U.S. PATENT DOCUMENTS

| | | | |
|---|---|---|---|
| 2005/0280008 A1* | 12/2005 | Ricks et al. | 257/79 |
| 2006/0138945 A1* | 6/2006 | Wolk et al. | 313/506 |
| 2006/0227079 A1* | 10/2006 | Kashiwabara | 345/76 |
| 2007/0102737 A1* | 5/2007 | Kashiwabara et al. | 257/291 |
| 2007/0222371 A1* | 9/2007 | Raychaudhuri et al. | 313/504 |
| 2007/0286944 A1* | 12/2007 | Yokoyama et al. | 427/66 |

FOREIGN PATENT DOCUMENTS

| | | |
|---|---|---|
| JP | 2006-269329 | 10/2006 |
| KR | 10-2005-0082652 | 8/2005 |
| KR | 10-2006-0007899 | 1/2006 |
| WO | WO 2005027586 A1 * | 3/2005 |
| WO | WO 2006033472 A1 * | 3/2006 |

OTHER PUBLICATIONS

Ma, H.L., et al. "Preparation and Properties of Transparent Conductive Indium Tin Oxide Films Deposited by Reactive Evaporation." Thin Solid Films, vol. 263 (1995): pp. 105-110.*

Kashiwabara, M., et al. "Late News Paper: Advanced AM-OLED Display Based on White Emitter with Microcavity Structure." SID 04 Digest, No. 29.5L (2004): pp. 1017-1019.*

* cited by examiner

ORGANIC LIGHT EMITTING DISPLAY AND FABRICATION METHOD OF THE SAME

CLAIM OF PRIORITY

This application makes reference to, incorporates the same herein, and claims all benefits accruing under 35 U.S.C. §119 from an application for ORGANIC LIGHT EMITTING DISPLAY AND FABRICATION METHOD OF THE SAME earlier filed in the Korean Intellectual Property Office on Nov. 10, 2006 and there duly assigned Serial No. 10-2006-0111161.

BACKGROUND OF THE INVENTION

1. Field of the Invention

The present invention relates to an organic light emitting display, and more particularly, to an organic light emitting display by which a device characteristic can be improved by varying a thickness of a layer in correspondence with differently colored pixels.

2. Description of the Related Art

An organic light emitting display is a self-luminescent display in which electrons and holes are injected into organic materials from an anode and a cathode and are recombined to generate excitons, and a specific wavelength of light is generated by energy generated from the excitons. Since the organic light emitting display does not require a separate light source such as a backlight unit, it can provide some advantages such as low power consumption, wide angle of view, and fast response speed in comparison with a liquid crystal display device. Therefore, the organic light emitting display has been highlighted as a next generation display.

The light emitting elements of the organic light emitting display include an anode which is an electrode for injecting holes, an organic thin film, and a cathode which is an electrode for injecting electrons. The organic thin film includes organic materials capable of emitting red, green, and blue light to implement a full-color display.

In addition, the organic thin film can have a multi-layer structure that includes an emitting layer (EML), an electron transport layer (ETL), and a hole transport layer (HTL) in order to increase light emitting efficiency by balancing the electrons and the positive holes. In some cases, the organic thin film can further include a separate electron injection layer (EIL) and a hole injection layer (HIL). In the organic light emitting display having a multi-layered organic thin film structure, a required optical thickness of the organic thin film is different depending on each pixel that implements a different color. However, what is needed is an improved structure for an organic light emitting display that provides improved color purity while being easy and inexpensive to make.

SUMMARY OF THE INVENTION

It is therefore an object of the present invention to provide for an improved organic light emitting display.

It is also an object of the present invention to provide an easy process of making an improved organic light emitting display.

It is still an object of the present invention to provide an organic light-emitting display device in which color coordinates and efficiency characteristics can be improved by differentiating the thickness of the organic thin film on a pixel-by-pixel basis, and a fabrication method of the same.

According to an aspect of the invention, there is provided an organic light emitting display that includes a substrate, a plurality of first electrodes arranged in a corresponding plurality of pixels, the plurality of pixels including red pixels, blue pixels and green pixels, a hole injection layer arranged on the first electrodes arranged on the substrate, the hole injection layer having different respective thicknesses in correspondence with the pixels, a hole transport layer entirely covering the hole injection layer, a white light emitting layer entirely covering the hole transport layer, an electron transport layer arranged on the white light emitting layer, a second electrode arranged on the electron transport layer and a color filter arranged on the second electrode.

The hole injection layer can include a first hole injection layer entirely covering the first electrodes arranged on the substrate and a patterned second hole injection layer arranged on the first hole injection layer and arranged separately over ones of the plurality of pixels. The second hole injection layer can be arranged only above ones of the pixels and not between ones of the pixels. A thickness of the second hole injection layer over red pixels can be greater than a thickness of the second hole injection layer over green pixels. The hole injection layer can be patterned separately for each of red, green, and blue pixels. A thickness of the hole injection layer over green pixels can be greater than a thickness of the hole injection layer over blue pixels, and a thickness of the hole injection layer over red pixels can be greater than a thickness of the hole injection layer over green pixels. The organic light emitting display can also include an electron injection layer arranged between the electrode transport layer and the second electrode.

According to another aspect of the present invention, there is provided a method of making an organic light emitting display, that includes, patterning a plurality of first electrodes on a substrate, the plurality of first electrodes being arranged in a corresponding plurality of pixels, the plurality of pixels including red pixels, blue pixels and green pixels, forming a hole injection layer having a different respective thicknesses in correspondence with the pixels, forming a hole transport layer on the hole injection layer, forming a white light emitting layer on the hole transport layer, forming an electron transport layer on the white light emitting layer, forming an electron injection layer on the electron transport layer, forming a second electrode on the electron injection layer and arranging a color filter on the second electrode.

The formation of the hole injection layer can include forming a first hole injection layer on the first electrodes arranged on the substrate, the first hole injection layer entirely covering the first electrodes arranged on the substrate and separately forming a second hole injection layer on the first hole injection layer over each of the red, green and blue pixels. In the formation of the second hole injection layer, the second hole injection layer can be separately formed for each of the red, green and blue pixels. The second hole injection layer can be formed to be thicker over the red pixels than over the green pixels. The formation of the hole injection layer can be performed by separately patterning the hole injection layer over each of red, green, and blue pixels. The formation of the hole injection layer can be performed via a laser induced thermal imaging (LITI) process. The formation of the hole injection layer can be performed via a vacuum evaporation process.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
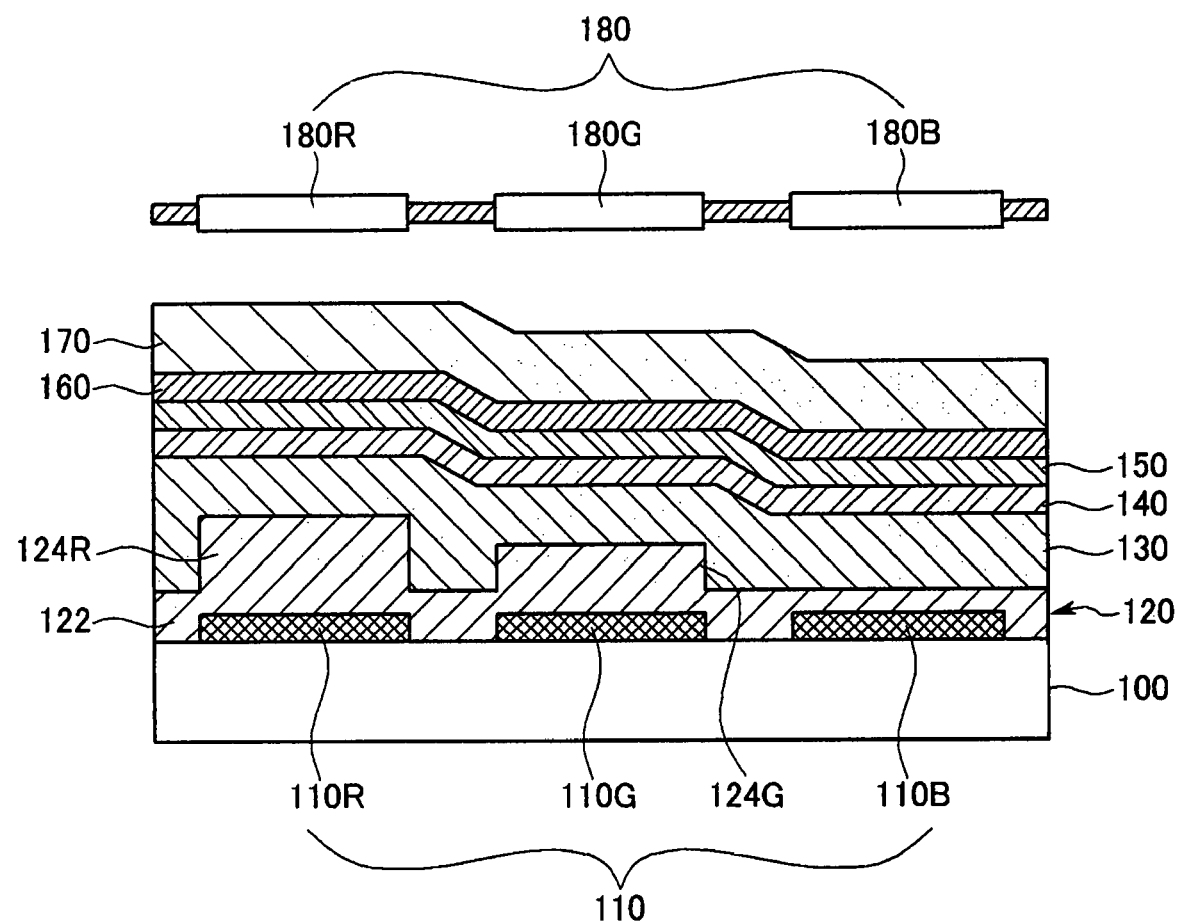
FIG. 1 is a partial cross-sectional view of an organic light emitting display according to a first embodiment of the present invention.

Turning to the figures, FIG. 1 is a partial cross-sectional view an organic light emitting display according to a first embodiment of the present invention. The structure of the organic light emitting display of FIG. 1 is just an example of the present invention, and the present invention is not limited thereto. Referring to FIG. 1, the organic light emitting display according to the first embodiment of the present invention includes a first electrode 110, a hole injection layer 120, a hole transport layer 130, a white light emitting layer 140, an electron transport layer 150, an electron injection layer 160, a second electrode 170, and a color filter 180 that are sequentially formed on a substrate 100.

First electrodes 110R, 110G, and 110B corresponding to each of red, green, and blue pixels respectively are separately provided in each pixel region on the substrate 100. In this case, the first electrode 110 can be an anode. The first electrode 110 can be made out of indium tin oxide (ITO) or can be a multi-layered structure including ITO and Al.

The hole injection layer 120 that facilitates hole injection from the first electrode 110 is formed on the first electrode 110. The hole injection layer 120 has a different thickness on a pixel-by-pixel basis. More specifically, a portion of the hole injection layer 120 located in a green pixel (i.e., a green pixel region) is thicker than a portion of the hole injection layer 120 located in a blue pixel (i.e., a blue pixel region). Similarly, a portion the hole injection layer 120 located in a red pixel (i.e., a red pixel region) is thicker than a portion of the hole injection layer 120 located in a green pixel. The hole injection layer 120 can have thicknesses such that an optimal optical path can be obtained for each of the different colored pixels.

According to the first embodiment, the hole injection layer 120 includes a first hole injection layer 122 that entirely covers the display region including the first electrodes 110 and exposed portions of substrate 100, and second hole injection layers 124R and 124G that are not formed in the blue pixel region but are separately formed in each of the red and green pixel regions respectively.

The hole transport layer 130 entirely covers the hole injection layer 120 having the aforementioned construction. The hole transport layer 130 receives holes from the hole injection layer 120, and transports the holes to the white light emitting layer 140. The hole transport layer 130 can be made out of an organic material having a wide energy gap.

The white light emitting layer 140 is formed on the hole transport layer 130. As shown in FIG. 1, the white light emitting layer 140 entirely covers the hole transport layer 130. The white light emitting layer 140 can be of a low molecular stack type arrangement of two color component system including red and blue or a three color component system including red, green, and blue, or of a high molecular dispersion type arrangement obtained by dispersing pigments into a base body made out of a polymer such as polyvinyl carbazole (PVK).

The electron transport layer 150, that prohibits or permits transportation of electrons, is formed on the white light emitting layer 140, and then the electron injection layer 160 is formed thereon. For example, the electron transport layer 150 can be made out of Alq3, and the electron injection layer 160 can be made out of LiF.

The second electrode 170 is formed on the electron injection layer 160. The second electrode 170 can be a cathode, which can be a transparent or semi-transparent electrode, to allow light to travel in a direction away from the substrate 100. The second electrode 170 can be made out of Al, or can be a multi-layered structure that includes Al and Ag.

A color filter 180 that includes color filters 180R, 180G, and 180B corresponding to red, green and blue colors respectively, are located on the aforementioned stack structure. The color filter 180 allows the organic light emitting display according to the first embodiment to implement a full color display.

As described above, since the thickness of the hole injection layer 120 varies in correspondence with differently colored pixel regions, light beams of a wavelength band other than a desired one are cut off by destructive interference, and only light beams of a desired wavelength band are strengthened by constructive interference. Therefore, it is possible to improve chromatic purity with the inclusion of such a hole injection layer 120. In addition, a path difference is provided for each color, that is, red, green, and blue. Therefore, efficiency of the organic light emitting display can be improved by using white light generated in the white light emitting layer 140 and the color filter 180.

According to the first embodiment, the organic thin film can be formed by performing a patterning process only two times for the hole injection layer 120 for the red and green pixel regions. Therefore, it is possible to simplify a fabricating process. As a result, manufacturing efficiency can be improved.

Figure 2:
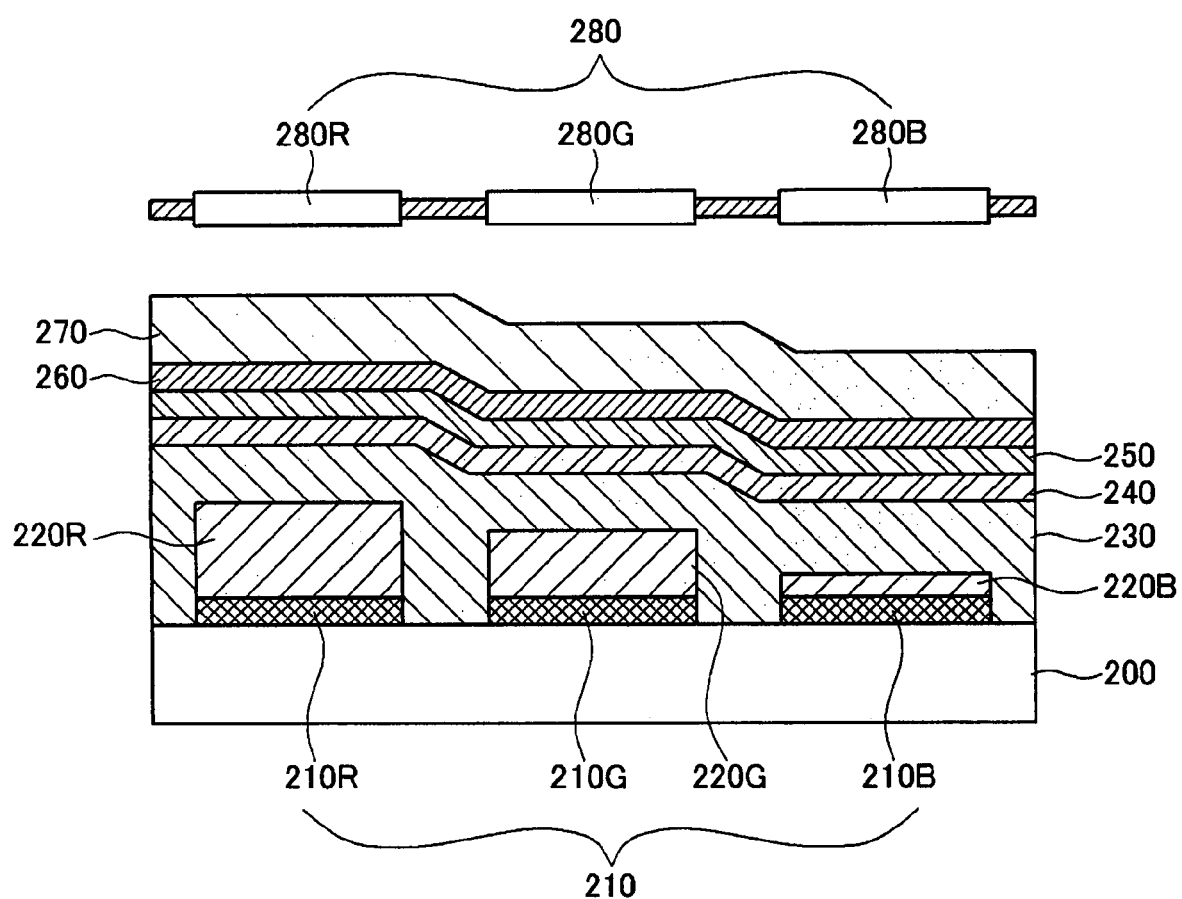
FIG. 2 is a partial cross-sectional view of an organic light emitting display according to a second embodiment of the present invention.

Turning now to FIG. 2, FIG. 2 is a partial cross-sectional view of an organic light emitting display according to a second embodiment of the present invention. Referring to FIG. 2, the organic light emitting display of the second embodiment of the present invention includes a first electrode 210, a hole injection layer 220, a hole transport layer 230, a white light emitting layer 240, an electron transport layer 250, an electron injection layer 260, a second electrode 270, and a color filter 280 sequentially formed on the substrate 200. Since other elements except for the hole injection layer 220 according to the second embodiment are similar to those described above in association with the first embodiment, they will not be described here.

According to the second embodiment, the hole injection layer 220 has a different thickness in each of the red, green, and blue pixel regions. More specifically, the thickness is greatest to least in the order of red, green, and blue pixel regions. In the second embodiment, the hole injection layer 220 is separately patterned in each pixel region. That is, the hole injection layers 220R, 220G, and 220B corresponding to each pixel are patterned on the first electrodes 210R, 210G, and 210B respectively that are separately formed for each pixel so that each of 220R, 220G and 220B has a different thickness. In the second embodiment, each hole injection layer 220R, 220G, and 220B can be formed using a laser induced thermal imaging (LITI) method or a vacuum evaporation method adopting a fine metal mask.

Figure 3A:
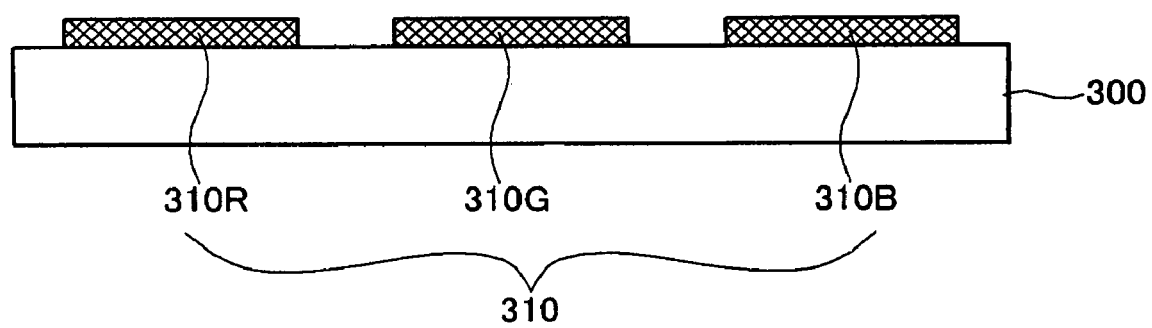
FIGS. 3A to 3F are process diagrams illustrating a fabrication method of an organic light emitting display according to an embodiment of the present invention.

Hereinafter, a fabrication method of an organic light emitting display of FIG. 1 according to an embodiment of the present invention will be described in conjunction with FIGS. 3A to 3F. Referring now to FIG. 3A, first electrodes 310R, 310G, and 310B corresponding to each of red, green, and blue pixels are patterned. For example, the first electrode 310 can be patterned by depositing metal such as Al or ITO on an entire surface and then performing an etch.

Figure 3B:
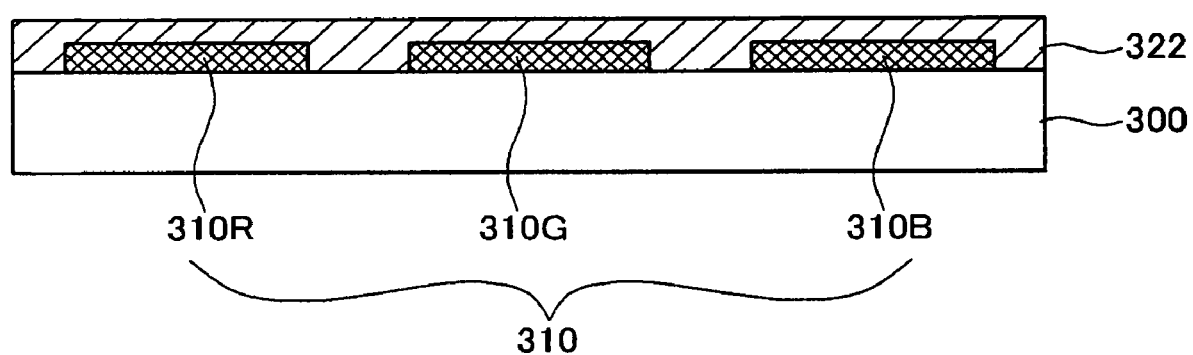
Figure 3C:
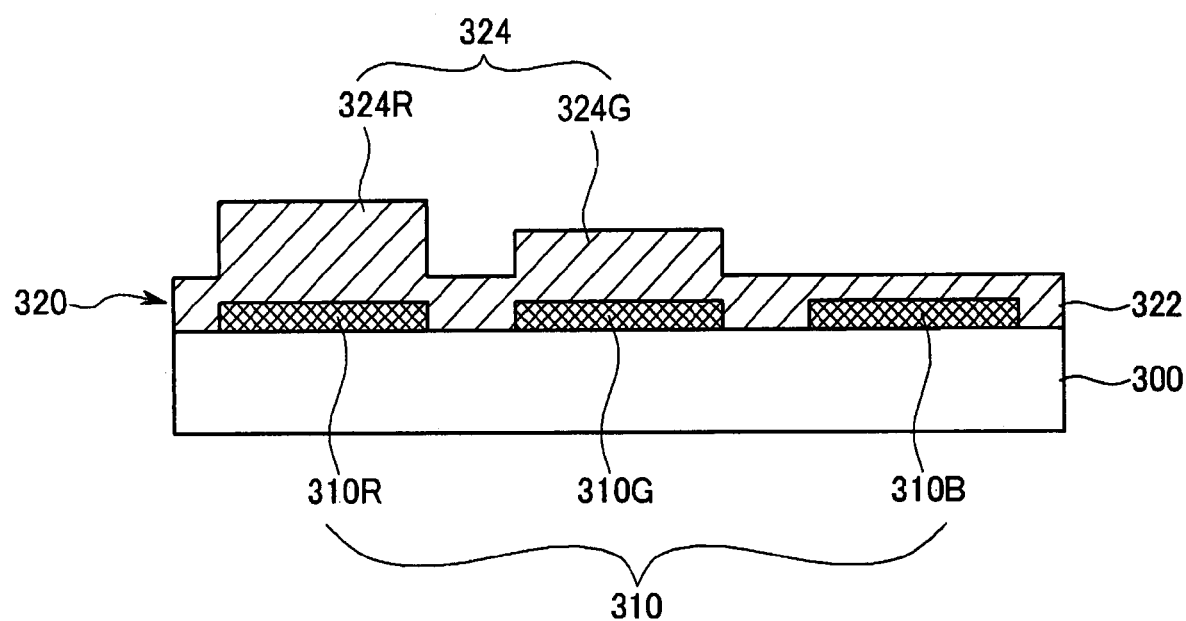

Subsequently, the first hole injection layer 322 is formed to entirely cover the first electrodes 310 on substrate 300 as shown in FIG. 3B, and then the second hole injection layers 324R and 324G are further formed in the red and green pixel regions through patterning as shown in FIG. 3C. As illustrated in FIG. 3C, the thickness of the second hole injection layer 324R located in the red pixel region is greater than the thickness of the second hole injection layer 324G located in the green pixel region. Therefore, the hole injection layer 320 including the first and second hole injection layers 322 and 324 has a greatest to least thickness in the order of red, green, and blue pixels. The second hole injection layer 324 does not entirely cover the first hole injection layer 322, but is separately patterned in each pixel region to provide a different thickness. The hole injection layer 320 can be formed by using a vacuum evaporation method or a laser induced thermal imaging (LITI) method. When the hole injection layer 320 is formed by using a LITI method, thermal degradation caused by heat can be prevented.

Figure 3D:
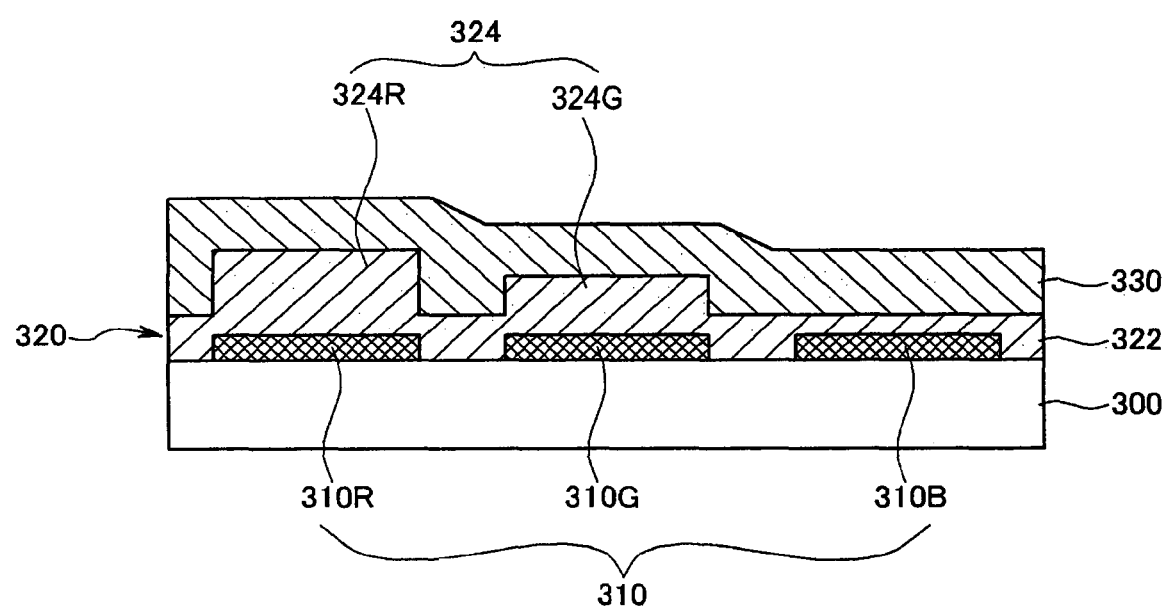

Turning now to FIG. 3D, the hole transport layer 330 is formed to entirely cover the hole injection layer 320. The hole transport layer 330 can be formed using a vacuum evaporation method or a LITI method.

Figure 3E:
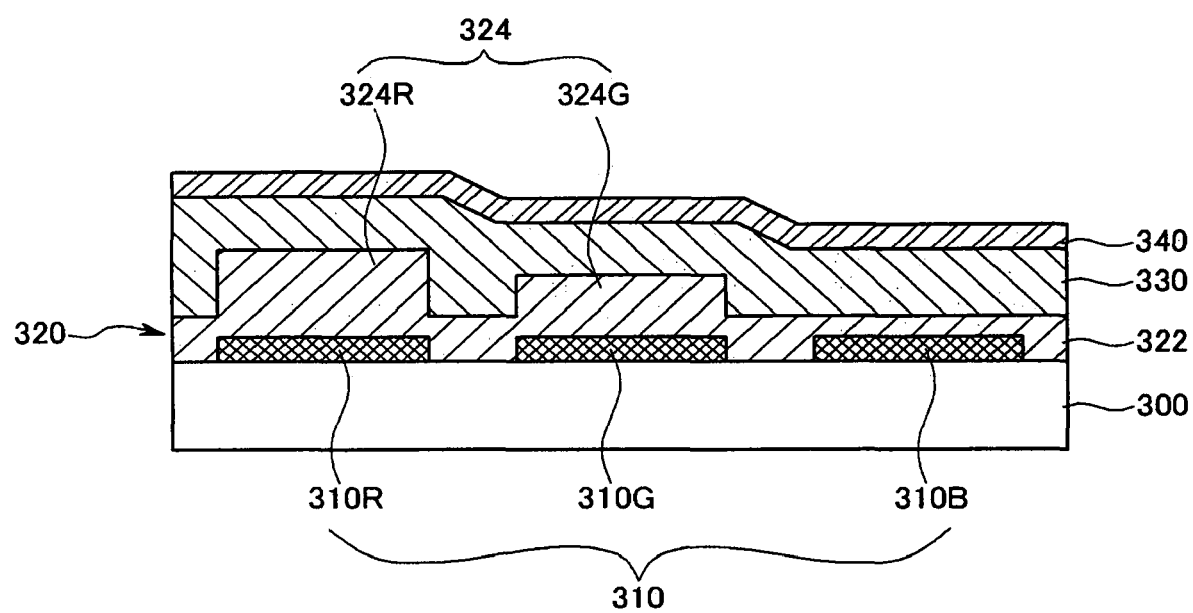

Turning now to FIG. 3E, the white light emitting layer 340 is formed on the hole transport layer 330. As described above, the white light emitting layer 340 can be of a low molecular stack type arrangement or of a high molecular dispersion type arrangement. When the white light emitting layer 340 is of a low molecular stack type having a two color component system including red and blue or a three color component system including red, green, and blue, the white light emitting layer 340 can be formed by sequentially depositing each light emitting layer in a vacuum environment. However, when the white light emitting layer 340 is of a high molecular dispersion type arrangement, the white light emitting layer 340 can be formed by spin-coating a polymer on the hole transport layer 330.

Figure 3F:
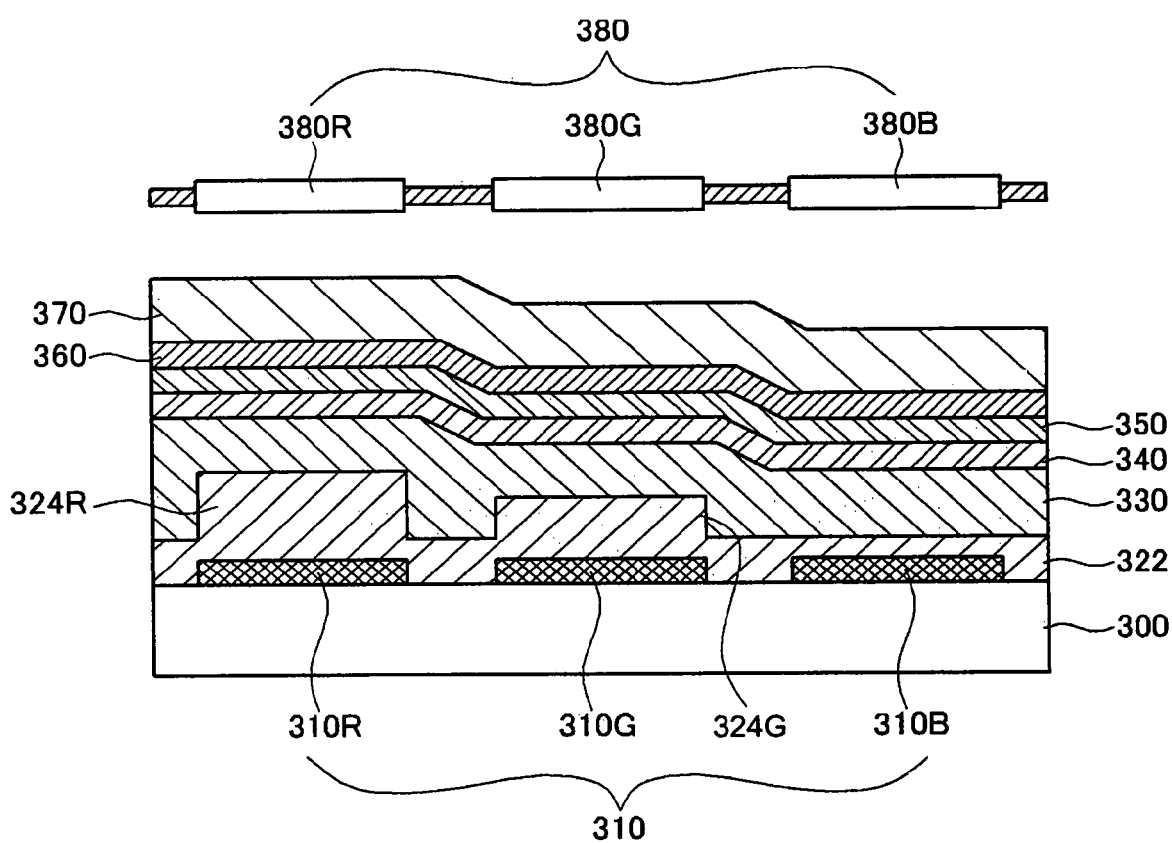

Turning now to FIG. 3F, the electron transport layer 350 and the electron injection layer 360 are sequentially formed on the white light emitting layer 340, and the second electrode 370 is formed thereon. Then, a color filter 380 is provided for each pixel. The electron transport layer 350 can be formed by depositing Alq3, and the electron injection layer 360 can be formed by depositing LiF. In addition, the second electrode 370 can be formed by depositing Al or Al and Ag.

According to the aforementioned fabrication method of the organic light emitting display of FIG. 1, an organic light emitting display having improved chromatic purity can be fabricated via a simple process. According to the organic light emitting display and the fabrication method of the same, it is possible to provide an organic light emitting display having improved chromatic purity. In addition, the number of patterning processes for the organic thin film can be reduced. Therefore, a fabricating process can be simplified, and fabricating efficiency can be improved.

Although the embodiments and the modified examples of the present invention have been described, the present invention is not limited to the embodiments and examples, but can be modified in various forms without departing from the scope of the appended claims, the detailed description, and the accompanying drawings of the present invention. Therefore, it is natural that such modifications belong to the scope of the present invention.

What is claimed is:

1. An organic light emitting display, comprising:
a substrate;
a plurality of first electrodes arranged in a corresponding plurality of pixels, the plurality of pixels including red pixels, blue pixels and green pixels;
a hole injection layer arranged on the first electrodes arranged on the substrate, the hole injection layer having different respective thicknesses in correspondence with the pixels;
a hole transport layer entirely covering the hole injection layer;
a white light emitting layer entirely covering the hole transport layer;
an electron transport layer arranged on the white light emitting layer;
a second electrode arranged on the electron transport layer; and
a color filter arranged on the second electrode,
wherein the hole injection layer includes:
    a first hole injection layer entirely covering a display region of the organic light emitting display that includes the first electrodes arranged on the substrate; and
    a patterned second hole injection layer arranged on the first hole injection layer and arranged separately over ones of the plurality of pixels, wherein the second hole injection layer is arranged only above ones of the first electrodes and not between ones of the first electrodes, and wherein the first hole injection layer is arranged both above ones of the first electrodes and on exposed portions of the substrate in between neighboring ones of the pixels.

2. The organic light emitting display of claim 1, wherein a thickness of the second hole injection layer over red pixels is greater than a thickness of the second hole injection layer over green pixels.

3. The organic light emitting display of claim 1, further comprising an electron injection layer arranged between the electron transport layer and the second electrode.

4. The organic light emitting display of claim 1, wherein the hole injection layer comprises:
the first hole injection layer covering an entirety of a display region of the display, the first hole injection layer being a blanket layer; and
the second hole injection layer arranged on the first hole injection layer and being a patterned layer arranged separately only over ones of the plurality of first. electrodes.

5. A method of fabricating an organic light emitting display, comprising:
patterning a plurality of first electrodes on a substrate, the plurality of first electrodes being arranged in a corresponding plurality of pixels, the plurality of pixels including red pixels, blue pixels and green pixels;
forming a hole injection layer having a different respective thicknesses in correspondence with the pixels;
forming a hole transport layer on the hole injection layer;
forming a white light emitting layer on the hole transport layer;
forming an electron transport layer on the white light emitting layer;
forming an electron injection layer on the electron transport layer;

forming a second electrode on the electron injection layer; and arranging a color filter on the second electrode, wherein the formation of the hole injection layer comprises:

forming a first hole injection layer on the substrate, the first hole injection layer entirely covering a display region of the light emitting display that includes the first electrodes arranged on the substrate and regions in between ones of the first electrodes; and separately forming a second hole injection layer on the first hole injection layer over each of the red, green and blue pixels.

6. The method of claim 5, wherein in he formation of the second hole injection layer, the second hole injection layer is separately formed for each of the red, green and blue pixels.

7. The method of claim 6, the second hole injection layer is formed to be thicker over the red pixels than over the green pixels.

8. The method of claim 5, wherein the formation of the hole injection layer is performed by separately patterning the hole injection layer over each of red, green, and blue pixels.

9. The method of claim 5, wherein the formation of the hole injection layer is performed via a laser induced thermal imaging (LITI) process.

10. The method of claim 5, wherein the formation of the hole injection layer is performed via a vacuum evaporation process.

11. The method of claim 5, the forming of the hole injection layer consists of just two patterning steps.

* * * * *